US007605907B2

(12) United States Patent
Cramer et al.

(10) Patent No.: US 7,605,907 B2
(45) Date of Patent: Oct. 20, 2009

(54) METHOD OF FORMING A SUBSTRATE FOR USE IN CALIBRATING A METROLOGY TOOL, CALIBRATION SUBSTRATE AND METROLOGY TOOL CALIBRATION METHOD

(75) Inventors: Hugo Augustinus Joseph Cramer, Eindhoven (NL); Antoine Gaston Marie Kiers, Veldhoven (NL); Gerardus Maria Johannes Wijnand Janssen, Uden (NL)

(73) Assignee: ASML Netherlands B.V., Veldhoven (NL)

( * ) Notice: Subject to any disclaimer, the term of this patent is extended or adjusted under 35 U.S.C. 154(b) by 322 days.

(21) Appl. No.: 11/727,648

(22) Filed: Mar. 27, 2007

(65) Prior Publication Data

US 2008/0239277 A1    Oct. 2, 2008

(51) Int. Cl.
G03B 27/42    (2006.01)
G03B 27/32    (2006.01)

(52) U.S. Cl. .......................... 355/77; 355/53
(58) Field of Classification Search .......... 355/53, 355/67, 72, 75, 77; 356/399, 400, 401
See application file for complete search history.

(56) References Cited

U.S. PATENT DOCUMENTS

| 5,703,692 | A | 12/1997 | McNeil et al. ............. 356/445 |
| 5,798,947 | A | 8/1998 | Ye et al. |
| 5,880,838 | A | 3/1999 | Marx et al. ............... 356/351 |
| 5,963,329 | A | 10/1999 | Conrad et al. ............. 356/372 |
| 6,388,737 | B1 * | 5/2002 | Maeda et al. ............... 355/67 |
| 6,597,447 | B1 | 7/2003 | Stirton et al. |
| 6,608,690 | B2 | 8/2003 | Niu et al. ................. 356/635 |
| 6,699,624 | B2 | 3/2004 | Niu et al. .................. 430/5 |
| 6,704,661 | B1 | 3/2004 | Opsal et al. ................ 702/27 |
| 6,721,691 | B2 | 4/2004 | Bao et al. ................. 702/189 |
| 6,738,138 | B2 | 5/2004 | Wei ......................... 356/369 |
| 6,753,961 | B1 | 6/2004 | Norton et al. ............. 356/364 |
| 6,768,983 | B1 | 7/2004 | Jakatdar et al. ............. 706/46 |
| 6,772,084 | B2 | 8/2004 | Bischoff et al. ........... 702/127 |
| 6,785,638 | B2 | 8/2004 | Niu et al. .................. 702/189 |
| 6,813,034 | B2 | 11/2004 | Rosencwaig et al. ...... 356/601 |
| 6,819,426 | B2 | 11/2004 | Sezginer et al. ............ 356/401 |
| 6,856,408 | B2 | 2/2005 | Raymond .................. 356/601 |
| 6,919,964 | B2 | 7/2005 | Chu ........................ 356/601 |
| 6,928,628 | B2 | 8/2005 | Seligson et al. .............. 716/4 |
| 6,972,852 | B2 | 12/2005 | Opsal et al. ............... 356/625 |
| 6,974,962 | B2 | 12/2005 | Brill et al. ................ 250/548 |
| 6,987,572 | B2 | 1/2006 | Lakkapragada et al. ..... 356/601 |
| 7,046,376 | B2 | 5/2006 | Sezginer .................. 356/601 |
| 7,061,615 | B1 | 6/2006 | Lowe-Webb .............. 356/401 |
| 7,061,623 | B2 | 6/2006 | Davidson .................. 356/497 |
| 7,061,627 | B2 | 6/2006 | Opsal et al. ............... 356/601 |
| 7,068,363 | B2 | 6/2006 | Bevis et al. ............. 356/237.5 |
| 2002/0102482 | A1 | 8/2002 | Smith et al. |
| 2004/0119970 | A1 | 6/2004 | Dusa et al. .............. 356/237.1 |

(Continued)

FOREIGN PATENT DOCUMENTS

EP    1 628 164 A2    2/2006

(Continued)

*Primary Examiner*—Peter B Kim
(74) *Attorney, Agent, or Firm*—Sterne, Kessler, Goldstein & Fox P.L.L.C (57) ABSTRACT

The present invention provides a method for forming a substrate for use in calibrating a metrology tool in order to compensate for orientation-dependent variations within the metrology tool.

18 Claims, 8 Drawing Sheets

U.S. PATENT DOCUMENTS

| | | | |
|---|---|---|---|
| 2005/0134820 A1* | 6/2005 | Mulder et al. | 355/67 |
| 2006/0033921 A1 | 2/2006 | Den Boef et al. | 356/446 |
| 2006/0058979 A1 | 3/2006 | Markle et al. | |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2008/0036986 A1* | 2/2008 | Yamaguchi | 355/53 |

FOREIGN PATENT DOCUMENTS

| | | |
|---|---|---|
| JP | 2002-083808 A | 3/2002 |
| JP | 2006-210754 A | 8/2006 |

* cited by examiner

METHOD OF FORMING A SUBSTRATE FOR USE IN CALIBRATING A METROLOGY TOOL, CALIBRATION SUBSTRATE AND METROLOGY TOOL CALIBRATION METHOD

FIELD

The present invention relates to methods of forming substrates for use in calibrating metrology tools, calibration substrates and methods of calibrating metrology tools.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Metrology tools used to monitor lithography processes and, in particular, CD metrology tools such as Scanning Electron Microscopes and scatterometers, are typically configured in such a way that the measurement accuracy may be dependent on the measurement orientation. For example, the magnification in the horizontal and vertical directions may have an offset. In addition, deviations from the ideal of the shape of the beam of radiation used to illuminate the metrology target and the angle of incidence of the beam of radiation on the metrology target may affect the measurement results. Clearly, such systematic metrology errors should be minimized. Accordingly, strict specifications for this kind of systematic metrology error are set. In order to minimize the systematic metrology errors, it is desirable to calibrate the metrology tools. Accordingly, a substrate having a known metrology target may be inspected by the metrology tool at a plurality of different orientations in order to determine the orientation dependent offsets. However, many CD metrology tools are constructed such that the substrate cannot be loaded or measured at different orientations, for example due to notch positioning mechanisms.

SUMMARY

It is desirable to provide a system by which it is possible to more easily compensate for orientation-dependent offsets within a metrology tool.

According to an embodiment of the invention, there is provided a method of forming a substrate suitable for use in calibrating a metrology tool, including providing a layer of radiation-sensitive material to a surface of a substrate; patterning a first beam of radiation using a patterning device that provides a calibration pattern including a first set of pattern features and a second set of pattern features; projecting the patterned first beam of radiation onto the radiation-sensitive material such that radiation patterned by the first set of pattern features of the calibration pattern forms a first calibration mark having a set of elongate pattern features and radiation patterned by the second set of pattern features of the calibration pattern forms a second calibration mark having a set of elongate pattern features; rotating the substrate by a predetermined angle relative to the projection system about an axis substantially perpendicular to the surface of the substrate; patterning a second beam of radiation using the patterning device and projecting it onto the radiation-sensitive material such that radiation patterned by the first set of pattern features of the calibration pattern forms a third calibration mark having a set of elongate pattern features and radiation patterned by the second set of pattern features of the calibration pattern forms a fourth calibration mark having a set of elongate pattern features; wherein the predetermined angle is such that the orientation of the elongate pattern features of the second calibration mark is substantially parallel to the orientation of the elongate pattern features of the third calibration mark.

Embodiments of the present invention further provide a substrate manufactured according to the above method and a method of calibrating a metrology tool using a substrate formed by the above method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
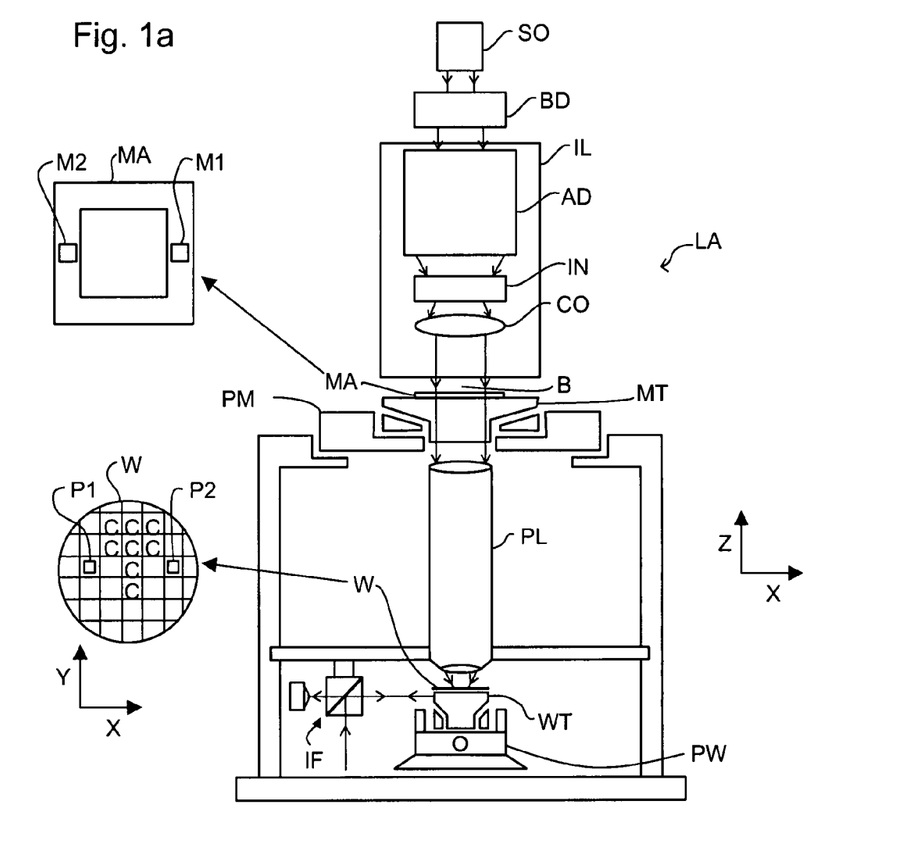
FIG. 1a depicts a lithographic apparatus in accordance with an embodiment of the invention.

FIG. 1a schematically depicts a lithographic apparatus LA. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate support (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) MA and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate support (e.g. substrate table) WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Support structure (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate support (e.g. substrate table) WT are kept essentially stationary, while an entire pattern imparted to the radiation beam is projected onto a target portion C at one time (i.e. a single static exposure). The substrate support (e.g. substrate table) WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate support (e.g. substrate table) WT are scanned synchronously while a pattern imparted to the radiation beam is projected onto a target portion C (i.e. a single dynamic exposure). The velocity and direction of the substrate support (e.g. substrate table) WT relative to the support structure (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate support (e.g. substrate table) WT is moved or scanned while a pattern imparted to the radiation beam is projected onto a target portion C. In this mode, generally a pulsed radiation source is employed and the programmable patterning device is updated as required after each movement of the substrate support (e.g. substrate table) WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
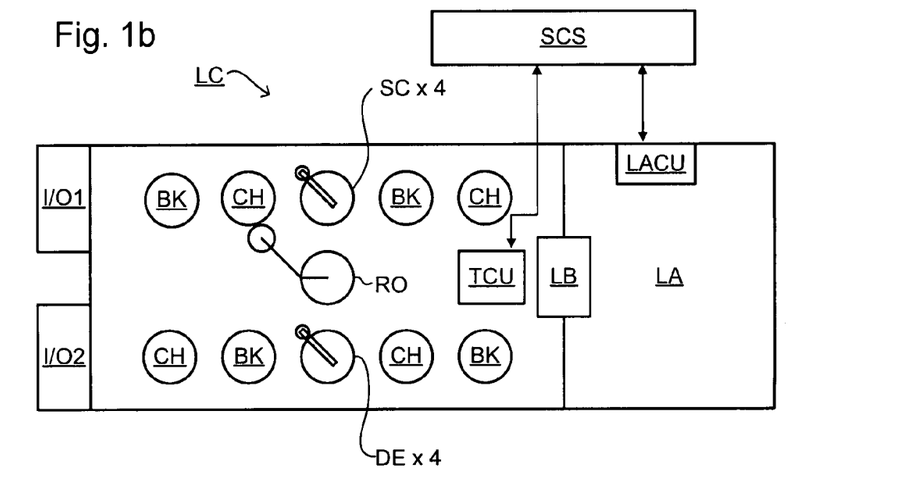
FIG. 1b depicts a lithographic cell or cluster in accordance with an embodiment of the invention.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as, for example, overlay errors between subsequent layers, line thicknesses, critical dimensions (CD). It will be appreciated that additional properties may be measured. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 2:
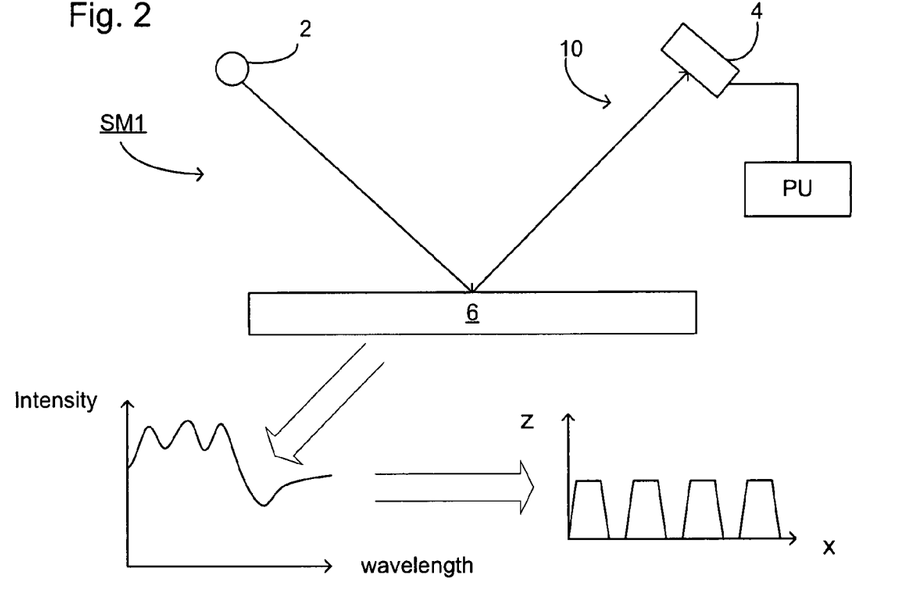
FIG. 2 depicts a first scatterometer.

FIG. 2 depicts a scatterometer SM1 which may be used in an embodiment of the present invention. It includes a broadband (white light) radiation projector 2 which projects radiation onto a substrate 6. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
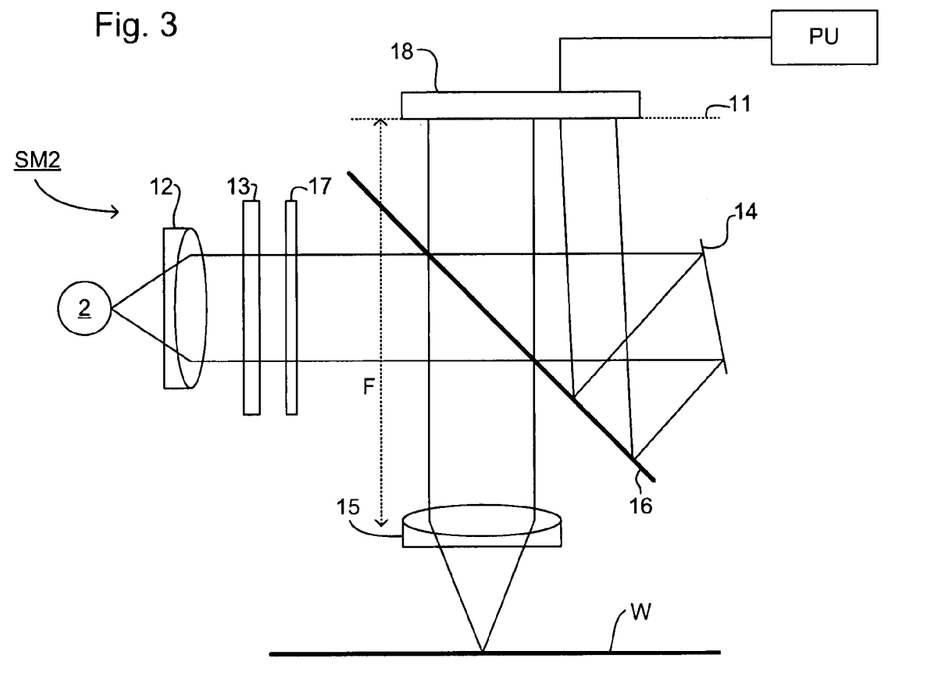
FIG. 3 depicts a second scatterometer.

Another scatterometer SM2 that may be used in an embodiment of the present invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length F of the lens system 15. However the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, about 405-790 nm or even lower, such as about 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least 2 $\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, hereby incorporated in its entirety by reference.

The target on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

An embodiment of the present invention provides a method of manufacturing a substrate that is specifically configured for use in the calibration of a metrology tool, in particular to compensate for systematic errors caused by orientation-dependent variations within the metrology tool. Furthermore, the substrate is configured such that the calibration tests may be performed in the metrology unit without the need for loading the substrate in the metrology unit at different orientations.

A substrate having a plurality of marks that are arranged at different orientations but are otherwise identical could be used to calibrate a metrology tool to compensate for orientation-dependent variations. However, in practice it is not possible to form marks at different orientations but which are otherwise absolutely identical. This is because if the marks are formed using different patterning devices or different parts of a single patterning device, variations between the patterning devices or portions of the patterning device will result in variations between the marks formed on the substrate. Alternatively, if the marks are formed by the same patterning device (or portion therefore) but at different times, for example using different exposures, variations in the processing conditions at different times (for example caused by variations in the radiation intensity between different exposures) will result in variations between the marks. Any variation between the marks, other than their orientation, means that the metrology tool cannot be calibrated by a direct comparison of measurements taken by the metrology tool from inspection of the marks at the different orientations.

Figure 4:
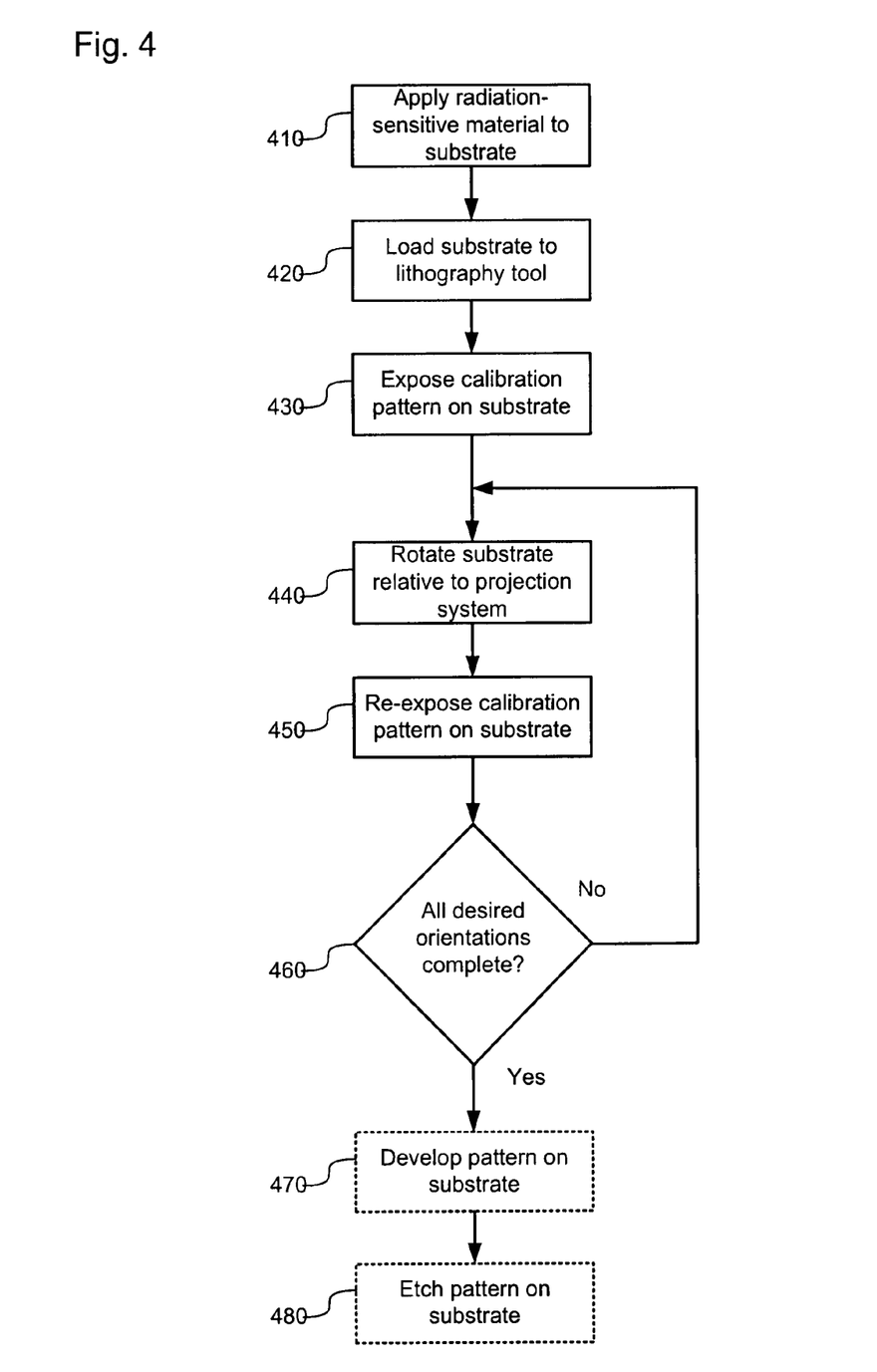
FIG. 4 depicts the process for forming a substrate for use in calibrating a metrology tool according to an embodiment of the present invention.

FIG. 4 depicts, schematically, the process for forming a substrate for use in calibrating a metrology tool according to the present invention. In procedure 410, a radiation-sensitive material, such as a resist, is provided to a surface of the substrate. In procedure 420, the substrate is loaded into a lithographic apparatus and in procedure 430 the substrate is exposed by a beam of radiation patterned by a patterning device having a calibration pattern. As described below in greater detail, the calibration pattern includes a plurality of sets of pattern features. When the calibration pattern is projected onto the substrate, each set of pattern features in the calibration pattern forms a corresponding calibration mark on the substrate. The calibration marks include a plurality of elongate features and may, for example, together form one or more gratings. Accordingly, the elongate features may be the striations of the gratings. Alternatively, for example, each of the elongate pattern features may include an array of structures such as an array of contact holes. The plurality of sets of pattern features included in the calibration pattern are arranged such that the elongate pattern features of each of the calibration marks are oriented in different directions.

In procedure 440 of the substrate forming process, the substrate is rotated within the lithographic apparatus and/or removed from the lithographic apparatus and re-loaded into the lithographic apparatus at a different orientation. Consequently, procedure 440 rotates the substrate by a predetermined angle relative to the projection system about an axis perpendicular to the surface of the substrate on which the radiation-sensitive material is provided. In procedure 450, the calibration pattern is again exposed on the substrate, providing a further plurality of calibration marks that each correspond to one of the plurality of pattern features within the calibration pattern. Preferably, the second plurality of calibration marks are formed adjacent the first plurality of calibration marks but sufficiently separated that there is no interference between the formation of the successive plurality of calibration marks.

Procedures 440 and 450 may be repeated a number of times as required, forming successive pluralities of calibration marks on the substrate, adjacent but not interfering with the already-formed calibration marks. Accordingly, as depicted in FIG. 4, the substrate forming method includes a decision at procedure 460, in which it is determined whether or not the calibration pattern has been exposed on the substrate at all of the desired orientations.

Once all of the desired patterns have been exposed on the substrate, the substrate may be processed in the conventional manner. For example, the radiation-sensitive material may be developed in procedure 470, especially if the metrology tool to be calibrated is intended to be used to inspect marks on a substrate after the radiation-sensitive material has been developed. Optionally, the substrate may be etched in procedure 480 in a conventional manner in order to provide a longer-lasting calibration substrate.

Figure 5A:
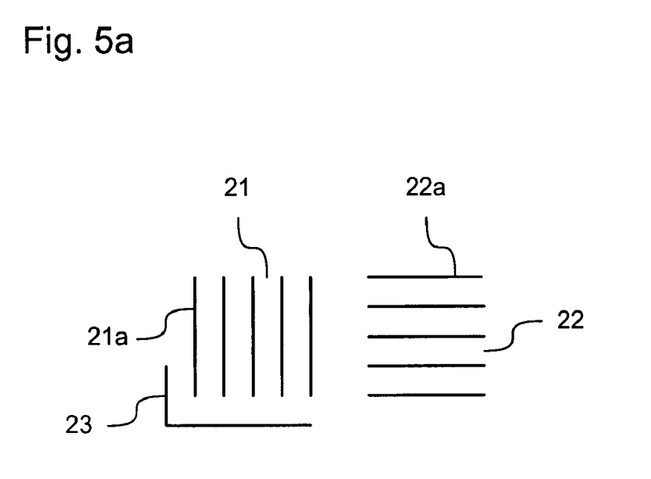
FIGS. 5a and 5b depict the formation of calibration marks on a substrate.
Figure 5B:
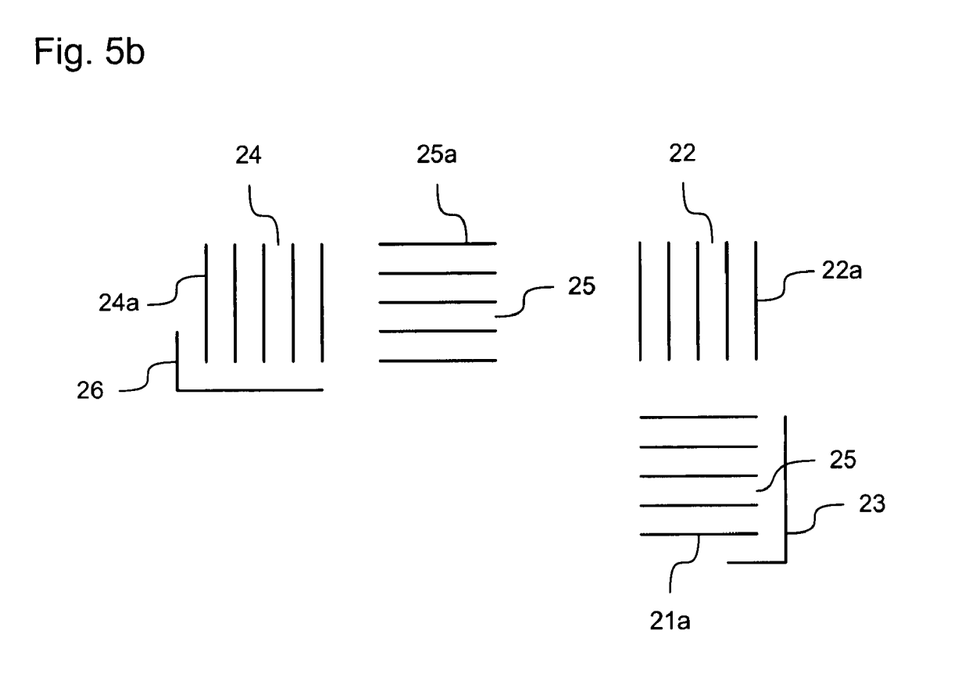

FIGS. 5a and 5b schematically depict the formation of calibration marks on a substrate. In particular, FIG. 5a depicts the marks formed on a substrate after a calibration pattern has been exposed on the substrate at a first orientation and FIG. 5b depicts the same region of the substrate after the calibration pattern has been exposed for a second time at a second orientation.

In detail, FIG. 5a shows first and second calibration marks 21,22 formed on the substrate that correspond to first and second sets of pattern features of the calibration pattern respectively. As shown, each of the first and second calibration marks 21,22 is included of a plurality of elongate pattern features 21a,22a. Furthermore, the orientation of the elongate pattern features 21a of the first calibration mark is different from the orientation of the elongate pattern features 22a of the second calibration mark 22. FIG. 5a includes an orientation mark 23. This is merely included to show the orientation of the first and second calibration marks 21,22.

FIG. 5b depicts the region of the substrate on which the first and second calibration marks 21,22 are formed after the substrate has been rotated relative to the projection system and the calibration pattern has been re-exposed on the substrate. As shown by the orientation mark 23, the first and second calibration marks 21,22 are rotated relative to their positions shown in FIG. 5a. In addition, third and fourth calibrations marks 24,25 are formed at an orientation corresponding to that of the first and second calibration marks 21,22 when they were originally formed, as shown by the orientation mark 26. The third and fourth calibration marks 24,25 are formed by the first and second sets of pattern features, respectively, of the calibration pattern. Accordingly, the first and third calibration marks 21,24 are formed by the same set of pattern features of the calibration pattern but, as a result of the rotation of the substrate between the exposures, the orientation of the elongate pattern features 24a of the third calibration mark is different from the orientation of the elongate pattern features 21a of the first calibration mark. Likewise, the orientation of the elongate pattern features of the second and fourth calibration marks 22,25 differ although the second and fourth calibrations marks 22,25 are formed by the same set of pattern features of the calibration pattern.

The extent of the rotation of the substrate between the first and second exposure of the calibration pattern on the substrate is carefully selected. In the arrangement depicted in FIGS. 5a and 5b, the rotation of the substrate between exposures is specifically selected such that the orientation of the elongate pattern features 22a of the second calibration mark 22 is substantially parallel to the orientation of the elongate pattern features 24a of the third calibration mark 24. Likewise, in the arrangement depicted in FIGS. 5a and 5b, the orientation of the elongate pattern features 21a of the first calibration mark 21 is substantially parallel to the orientation of the elongate pattern features 25a of the fourth calibration mark 25.

The formation of the calibration marks on the substrate in the manner discussed above provides a beneficial substrate for calibrating a metrology tool. In particular, differences between the results of inspecting the calibration marks 21,22, 24,25 are generated by three factors: (i) differences between the first and second sets of pattern features in the calibration pattern and/or differences introduced by the projection system of the lithography apparatus; (ii) differences between the radiation intensity of the two exposures; and (iii) differences introduced by the orientation-dependent systematic error of the metrology tool. It will be appreciated that the difference between the results for the first and second calibration marks 21,22 and between the third and fourth calibration marks 24,25 will be partly factor (i) and partly factor (iii). In contrast, the difference in the results between the first calibration mark 21 and the third calibration mark 24 and between the second calibration mark 22 and the fourth calibration mark 25 will be partly caused by the factor (ii) and partly caused by the factor (iii). Finally, the difference in the inspection results between the first calibration mark 21 and the fourth calibration mark 25 and between the second calibration mark 22 and the third calibration mark 24 will be partly caused by factor (i) and partly caused by factor (ii). Consequently, by comparing the differences of the results of the inspection by the metrology tool of all four calibration marks 21,22,24,25, it is possible to eliminate the influence of factors (i) and (ii), resulting in the influence only of factor (iii), namely the effect of the orientation-dependent systematic error of the metrology tool. Accordingly, it is possible to use the results of the inspection of the four calibration marks to calibrate the metrology tool.

Figure 5C:
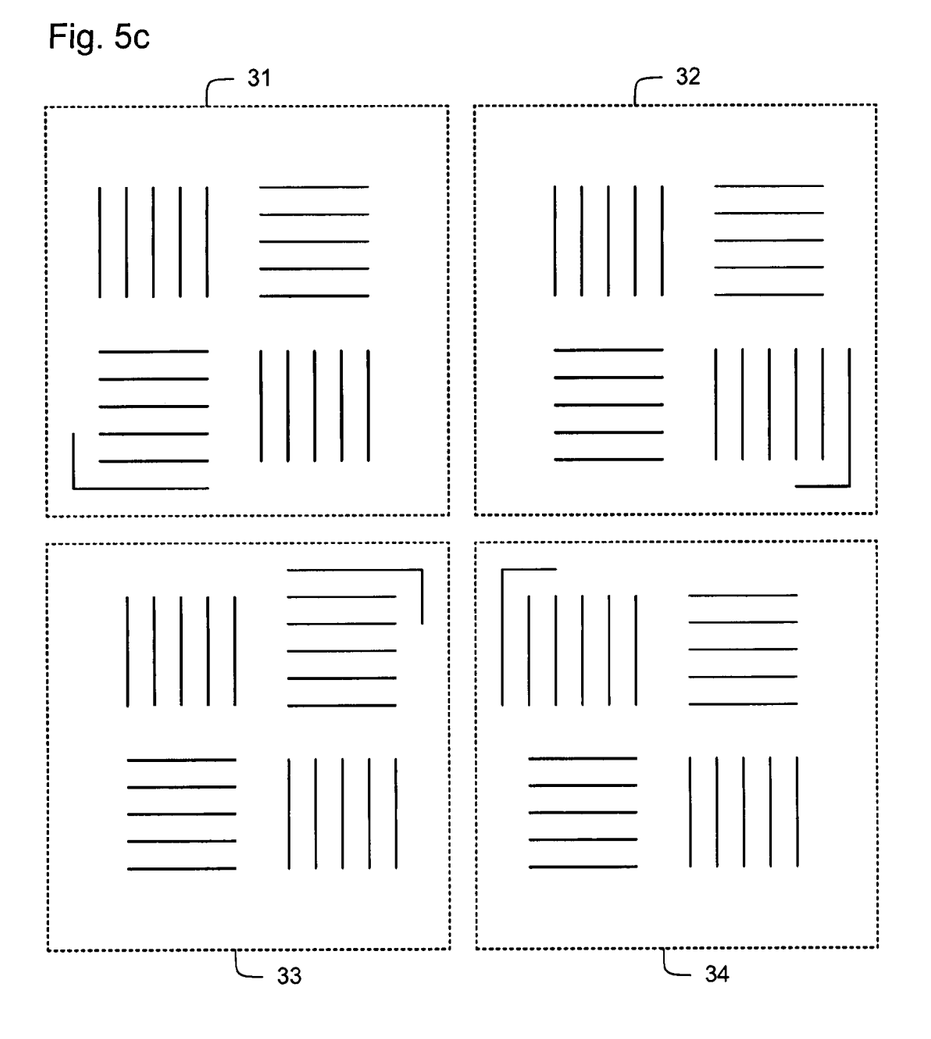
FIG. 5c depicts a variation of the arrangement of calibration marks depicted in FIG. 5b.

Although, as shown in FIGS. 5a and 5b, the calibration pattern may simply include first and second sets of pattern features used to form two calibration marks having a respective set of elongate pattern features that are oriented differently from each other, other calibration patterns may be used. For example, as shown in FIG. 5c, in addition to the first and second sets of pattern features used to form respective calibration marks in each exposure, the calibration pattern may include third and fourth sets of pattern features that produce two additional calibration marks that are similar to the first and second calibration marks. Accordingly, as shown in FIG. 5c each set of calibration marks 31,32,33,34, corresponding to a single exposure, includes two pairs of calibration marks having elongate pattern features that are parallel to each other. This may be beneficial because firstly it provides additional data that may improve the calibration of the metrology tool and secondly because metrology tools may be configured to inspect combinations of features having this configuration. Accordingly, systems within the metrology tool for identifying "recognition" metrology targets and positioning the inspection unit within the metrology tool to inspect the metrology targets can be instructed with a single pattern for all calibration marks. This eliminates potential offsets introduced when for each calibration mark a different recognition and positioning instruction have to be used.

Furthermore, as depicted in FIG. 5c, more than two exposures may be used. Accordingly, as shown in FIG. 5c, procedures 440 and 450 of the substrate forming method depicted in FIG. 4 may be repeated four times in order to provide four sets of calibration marks 31,32,33,34 at different respective orientations. Again, this may provide additional data in order to improve the accuracy of the calibration.

Figure 6:
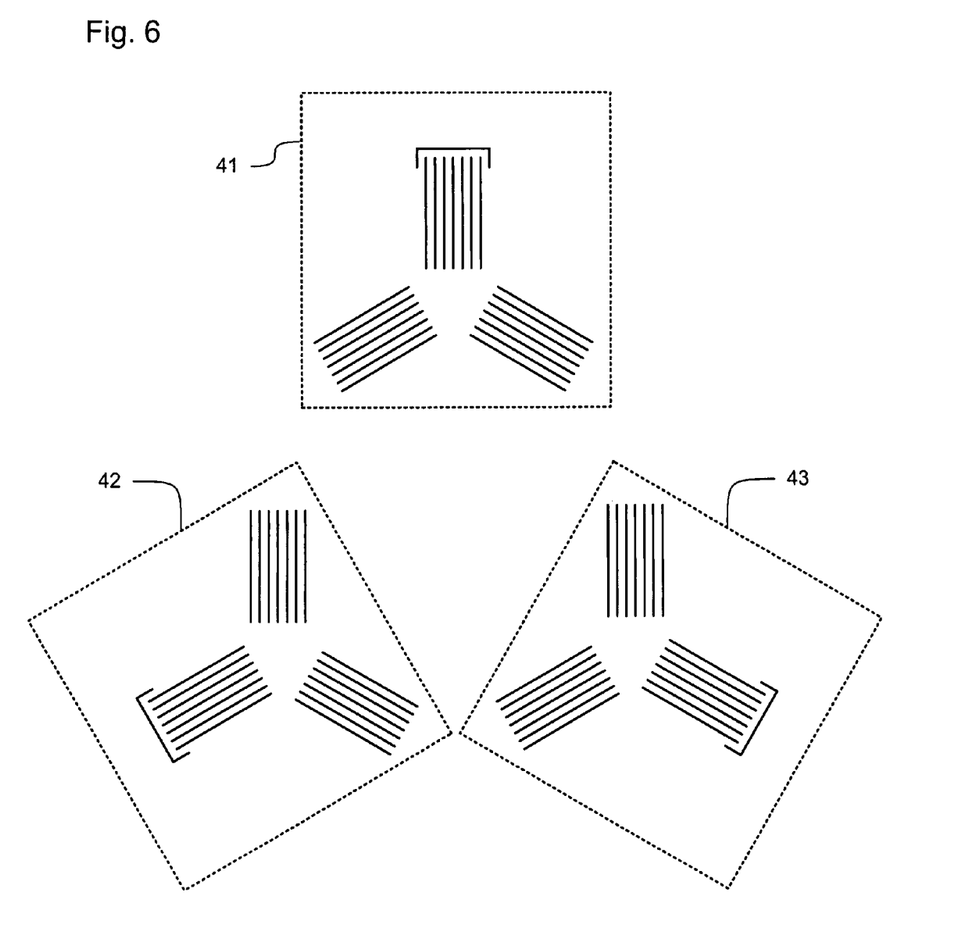
FIG. 6 depicts an alternative set of calibrations marks that may be used in an embodiment of the invention.

In addition, although as depicted in FIGS. 5a, 5b and 5c, the elongate pattern features of some calibration marks may be perpendicular to the orientation of the elongate pattern features of the remaining calibration marks, this need not be the case. For example, as depicted in FIG. 6, the calibration pattern may include three sets of pattern features configured to form respective calibration marks on a substrate such that the angle between the orientation of the elongate pattern features of any two of the calibration marks is about 120°. Accordingly, a set of calibration marks 41, such as is depicted in FIG. 6, may be formed. In such an arrangement, the procedures 440 and 450 of the substrate forming method depicted in FIG. 4 would be repeated three times in total, with the substrate rotated about 120° between each exposure such that the three exposures in total provides three sets of calibration marks 41,42,43 as depicted in FIG. 6. As will be appreciated, in so doing the calibration marks formed on the substrate will be arranged such that the elongate pattern features formed from one set of pattern features in the calibration pattern by a given exposure will be substantially parallel to the elongate pattern features formed by another set of pattern features in the calibration pattern by another exposure, and so on. Accordingly, it remains possible to eliminate the effect of the use of different sets of pattern features in the calibration pattern and the effect of different radiation intensities in the different exposures in order to determine the effect of the orientation-dependent variation of the metrology tool.

Figure 7:
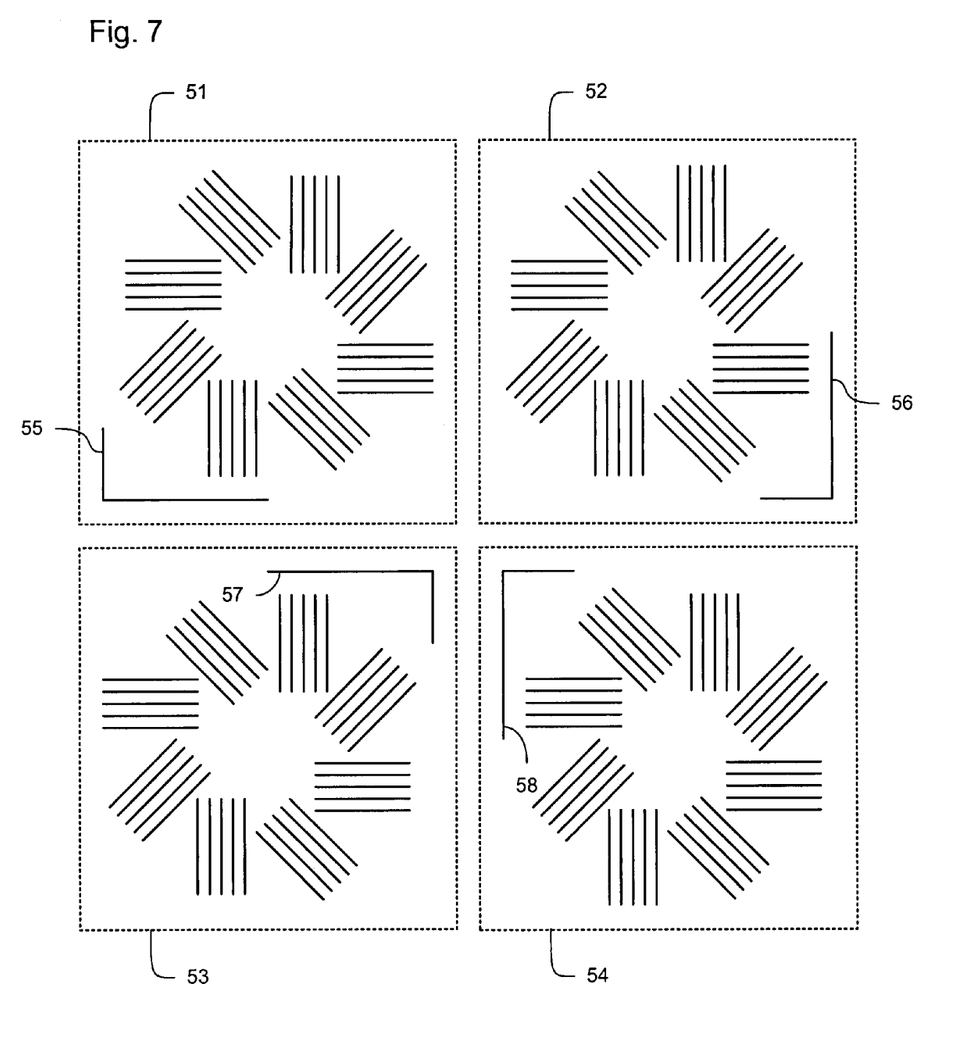
FIG. 7 depicts a further variation of the set of calibration marks that may be used in an embodiment of the invention.

FIG. 7 depicts a preferred arrangement of the sets of calibration marks. As shown each set of calibration marks 51,52, 53,54 includes eight calibration marks that are simultaneously formed using eight corresponding sets of pattern features in the calibration pattern. Within each set of calibration marks, there are four pairs of calibration marks, each pair of calibration marks being configured such that their respective elongate pattern features are substantially parallel. A first and second pair of calibration marks are arranged such that their elongate pattern features are perpendicular to each other. The third and fourth pairs of calibration marks are configured such that their respective elongate pattern features are perpendicular to each other and each are at about 45° to the elongate pattern features of one of the first and second pairs of calibration marks. In addition, as indicated by the respective orientation marks 55,56,57,58 shown in FIG. 7, between the formation of each of the sets of calibration marks 51,52,53, 54, the substrate is rotated by about 45°.

As before, it is possible from considering the differences between the results of inspecting the calibration marks in the metrology tool to eliminate the effect of differences in the radiation of intensity of the successive exposures and the effect of differences between the sets of pattern features in the calibration pattern. It is therefore possible to determine the effect of the orientation-dependent variation of the metrology tool. However, as will be appreciated, further information is available using the sets of calibration target depicted in FIG. 7. Accordingly, it may be possible to, at least partially, calibrate for the effects of any non-uniformities in the shape of the beam used to illuminate the metrology targets in the metrology tool and/or for imperfections in the angle of incidents of the beam of radiation on the metrology targets.

Figure 8:
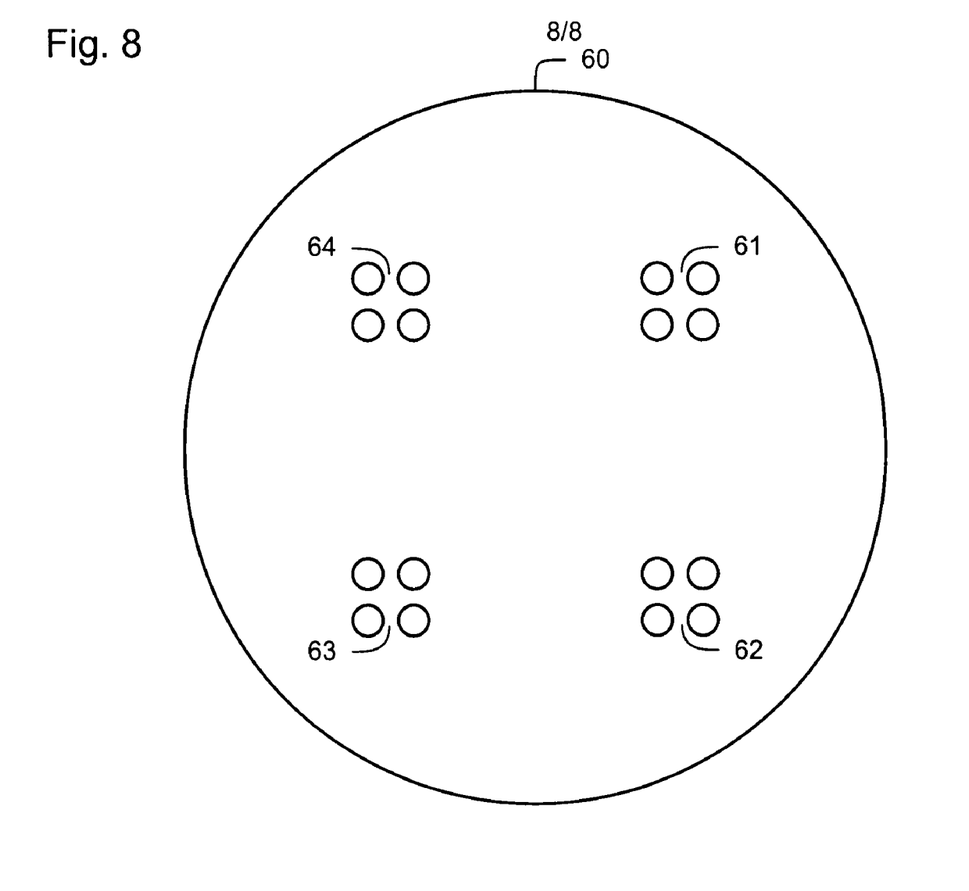
FIG. 8 depicts a possible arrangement of calibration marks on a substrate.

As discussed above, the calibration marks are preferably all formed adjacent to one another on the substrate. This may minimize any variation between the calibration marks caused by critical dimension (CD) variation across the substrate. However, as depicted in FIG. 8, the substrate 60 for use in calibrating a metrology tool may be arranged to have multiple sets 61,62,63,64 of calibration marks arranged in different regions of the substrate, where each set of calibration marks corresponds to any one of the sets of calibration marks discussed above. In this case, the first set 61 of calibration marks may be formed by a first plurality of exposures and the second set 62 of calibration targets may be formed subsequently by a second plurality of exposures and so on. Alternatively, subsets of calibration marks within each set 61,62,63,64 of calibration marks may be formed simultaneously by each exposure, reducing the time to form the substrate.

It should be appreciated that variations of the sets of calibration marks discussed above may be employed. In particular, procedures 440 and 450 of the substrate forming method depicted in FIG. 4 may be repeated a different number of times than that described above. Alternatively or additionally, the calibration pattern may include different numbers of sets of pattern features than those discussed above and the angle between the orientation of the elongate pattern features of the calibration marks formed from a single exposure may be different from those discussed above and/or the angle of rotation of the substrate between successive exposures may be different from that discussed above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. It should be appreciated that a substrate formed according to the method of the present invention may be used in calibrating a metrology tool used to inspect substrates processed by an imprint lithography tool.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of forming a substrate suitable for use in calibrating a metrology tool, comprising:
    providing a layer of radiation-sensitive material to a surface of a substrate;
    patterning a first beam of radiation using a patterning device that provides a calibration pattern including a first set of pattern features and a second set of pattern features;
    projecting the patterned first beam of radiation onto the radiation-sensitive material such that radiation patterned by the first set of pattern features of the calibration pattern forms a first calibration mark having a set of elongate pattern features and radiation patterned by the second set of pattern features of the calibration pattern forms a second calibration mark having a set of elongate pattern features;
    rotating the substrate by a predetermined angle relative to the projection system about an axis substantially perpendicular to the surface of the substrate;
    patterning a second beam of radiation using the patterning device and projecting it onto the radiation-sensitive material such that radiation patterned by the first set of pattern features of the calibration pattern forms a third calibration mark having a set of elongate pattern features and radiation patterned by the second set of pattern features of the calibration pattern forms a fourth calibration mark having a set of elongate pattern features;
    wherein the predetermined angle is such that the orientation of the elongate pattern features of the second calibration mark is substantially parallel to the orientation of the elongate pattern features of the third calibration mark.

2. A method according to claim 1, wherein the calibration pattern further includes a third set of pattern features and radiation in the patterned first beam of radiation patterned by the third set of pattern features of the calibration pattern forms a fifth calibration mark having a set of elongate pattern features; wherein the method further comprises
    rotating the substrate relative to the projection system about the axis further by a second predetermined angle; and
    patterning a third beam of radiation using the patterning device and projecting it onto the radiation-sensitive material such that radiation patterned by the first set of pattern features of the calibration pattern forms a sixth calibration mark having a set of elongate pattern features; and
    the second predetermined angle is such that the orientation of the elongate pattern features of the fifth calibration mark is substantially parallel to the orientation of the elongate pattern features of the sixth calibration mark.

3. A method according to claim 2, wherein the orientation of the elongate pattern features of no two of the first, second and fifth calibration marks is substantially parallel.

4. A method according to claim 2, wherein, when the second beam of radiation is patterned and projected onto the radiation-sensitive material, radiation patterned by the third set of pattern features of the calibration pattern forms a calibration mark having elongate pattern features and, when the third beam of radiation is patterned and projected onto the radiation-sensitive material, radiation patterned by the second and third sets of pattern features of the calibration pattern form respective calibration marks having elongate pattern features.

5. A method according to claim 2, wherein the calibration pattern further includes a fourth set of pattern features and radiation in the patterned first beam of radiation patterned by the fourth set of pattern features of the calibration pattern forms a seventh calibration mark having a set of elongate pattern features;
    wherein the method further comprises rotating the substrate relative to the projection system about the axis further by a third predetermined angle; and
    patterning a fourth beam of radiation using the patterning device and projecting it onto the radiation-sensitive material such that radiation patterned by the first set of pattern features of the calibration pattern forms an eighth calibration mark having a set of elongate pattern features; and
    the third predetermined angle is such that the orientation of the elongate pattern features of the seventh calibration mark is substantially parallel to the orientation of the elongate pattern features of the eighth calibration mark.

6. A method according to claim 5, wherein the orientation of the elongate pattern features of no two of the first, second, fifth and seventh calibration marks is substantially parallel.

7. A method according to claim 5, wherein, when the second beam of radiation is patterned and projected onto the radiation-sensitive material, radiation patterned by the third and fourth sets of pattern features of the calibration pattern form respective calibration marks having elongated pattern features and, when the third and fourth beams of radiation are patterned and projected onto the radiation-sensitive material, respectively, radiation patterned by the second, third and fourth pattern features of the calibration pattern form respective calibration marks having elongate pattern features.

8. A method according to claim 5, further comprising:
    with the substrate at the same orientation relative to the projection system as it is when each beam of radiation is patterned and projected onto the radiation-sensitive material, patterning at least one additional beam of radiation using the patterning device and projecting it onto the radiation-sensitive material such that each additional beam of radiation forms calibration marks corresponding to those formed by the patterned beam of radiation projected onto the radiation-sensitive material at that substrate orientation but at a different location on the substrate.

9. A method according to claim 1, further comprising:
    with the substrate at the same orientation relative to the projection system as it is when each beam of radiation is patterned and projected onto the radiation-sensitive material, patterning at least one additional beam of radiation using the patterning device and projecting it onto the radiation-sensitive material such that each additional beam of radiation forms calibration marks corresponding to those formed by the patterned beam of radiation projected onto the radiation-sensitive material at that substrate orientation but at a different location on the substrate.

10. A method according to claim 1, further comprising developing the patterns formed on the substrate by the selective exposure of the radiation-sensitive material.

11. A method according to claim 10, further comprising etching the substrate.

12. A method according to claim 1, wherein the elongate pattern features of a calibration mark are striations forming grating.

13. A method according to claim 1, wherein each the elongate pattern feature comprises an array of structures.

14. A method of calibrating a metrology tool, comprising inspecting a plurality of calibration marks on a substrate formed by a method including
providing a layer of radiation-sensitive material to a surface of the substrate;
patterning a first beam of radiation using a patterning device that provides a calibration pattern including a first set of pattern features and a second set of pattern features;
projecting the patterned first beam of radiation onto the radiation-sensitive material such that radiation patterned by the first set of pattern features of the calibration pattern forms a first calibration mark having a set of elongate pattern features and radiation patterned by the second set of pattern features of the calibration pattern forms a second calibration mark having a set of elongate pattern features;
rotating the substrate by a predetermined angle relative to the projection system about an axis substantially perpendicular to the surface of the substrate;
patterning a second beam of radiation using the patterning device and projecting it onto the radiation-sensitive material such that radiation patterned by the first set of pattern features of the calibration pattern forms a third calibration mark having a set of elongate pattern features and radiation patterned by the second set of pattern features of the calibration pattern forms a fourth calibration mark having a set of elongate pattern features;
wherein the predetermined angle is such that the orientation of the elongate pattern features of the second calibration mark is substantially parallel to the orientation of the elongate pattern features of the third calibration mark.

15. A method according to claim 14, wherein the difference between results of inspecting a plurality of calibration marks, formed by radiation patterned by the same set of pattern features of the calibration pattern but that have elongate pattern features that are not parallel to each other, is used to calibrate an orientation offset of the metrology tool.

16. A method according to claim 15, wherein the differences between the results of inspecting three or more calibration marks, formed by radiation patterned by the same set of pattern features of the calibration pattern but that have elongate pattern features that are not parallel to any of the others, is used to calibrate the metrology tool for at least one of the offset of the shape of the beam of radiation used to illuminate the calibration marks in the metrology tool and the offset of the angle of incidence of the beam of radiation used to illuminate the calibration marks in the metrology tool.

17. A method according to claim 16, wherein the differences between the results of inspecting a plurality of calibration marks having elongate pattern features that are substantially parallel to each other are used to compensate for variations in the radiation intensity of the different beams of radiation used to form the calibration marks.

18. A method according to claim 15, wherein the differences between the results of inspecting a plurality of calibration marks having elongate pattern features that are substantially parallel to each other are used to compensate for variations in the radiation intensity of the different beams of radiation used to form the calibration marks.

* * * * *